(12) United States Patent
Pio

(10) Patent No.: US 12,599,026 B2
(45) Date of Patent: *Apr. 7, 2026

(54) SEMICONDUCTOR PACKAGES WITH PATTERNS OF DIE-SPECIFIC INFORMATION

(71) Applicant: Micron Technology, Inc., Boise, ID (US)

(72) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/928,521

(22) Filed: Oct. 28, 2024

(65) Prior Publication Data

US 2025/0054776 A1 Feb. 13, 2025

Related U.S. Application Data

(63) Continuation of application No. 17/307,273, filed on May 4, 2021, now Pat. No. 12,131,916, which is a
(Continued)

(51) Int. Cl.
*H01L 21/56* (2006.01)
*G06K 19/06* (2006.01)
(Continued)

(52) U.S. Cl.
CPC ...... *H01L 21/561* (2013.01); *G06K 19/06009* (2013.01); *G06K 19/06037* (2013.01);
(Continued)

(58) Field of Classification Search
None
See application file for complete search history.

(56) References Cited

U.S. PATENT DOCUMENTS

| | | |
|---|---|---|
| 3,598,490 A | 8/1971 | Yearsley |
| 5,408,131 A | 4/1995 | Khatri et al. |
| (Continued) | | |

FOREIGN PATENT DOCUMENTS

| | | |
|---|---|---|
| CN | 104318946 A | 1/2015 |
| CN | 109604191 A | 4/2019 |
| CN | 111384020 A | 7/2020 |

OTHER PUBLICATIONS

CN Patent Application No. 202010840914.4—Chinese Office Action and Search Report, dated Jul. 20, 2023, with English Translation, 13 pages.

(Continued)

*Primary Examiner* — Kristy A Haupt
(74) *Attorney, Agent, or Firm* — Dorsey & Whitney LLP

(57) ABSTRACT

Semiconductor device packages and associated methods are disclosed herein. In some embodiments, the semiconductor device package includes (1) a first surface and a second surface opposite the first surface; (2) a semiconductor die positioned between the first and second surfaces; and (3) a pattern positioned in a designated area of the first surface. The pattern includes multiple bit areas. Each of the bit areas represents a first bit information or a second bit information. the pattern presents information for operating the semiconductor die. The pattern is configured to be read by a pattern scanner.

20 Claims, 20 Drawing Sheets

Related U.S. Application Data continuation of application No. 16/548,126, filed on Aug. 22, 2019, now Pat. No. 11,031,258.

(51) Int. Cl.
  *H01L 21/78* (2006.01)
  *H01L 23/00* (2006.01)
  *H01L 23/28* (2006.01)

(52) U.S. Cl.
  CPC . *G06K 19/06093* (2013.01); *G06K 19/06159* (2013.01); *H01L 21/568* (2013.01); *H01L 21/78* (2013.01); *H01L 23/28* (2013.01); *H01L 24/19* (2013.01); *H01L 24/20* (2013.01); *H01L 24/92* (2013.01); *H01L 24/96* (2013.01); *H01L 24/97* (2013.01)

(56) References Cited

U.S. PATENT DOCUMENTS

| | | | |
|---|---|---|---|
| 7,548,643 | B2 | 6/2009 | Davis et al. |
| 8,453,922 | B2 | 6/2013 | Ragnet et al. |
| 8,489,924 | B2 | 7/2013 | Nakatsugawa et al. |
| 10,019,627 | B2 | 7/2018 | Kutter et al. |
| 10,210,920 | B1 | 2/2019 | Chen et al. |
| 10,359,705 | B2 | 7/2019 | Wang |
| 10,566,222 | B2 | 2/2020 | Yokoyama et al. |
| 10,714,427 | B2 | 7/2020 | De Langen et al. |
| 11,031,258 | B2 * | 6/2021 | Pio ................... G06K 19/06159 |
| 11,063,000 | B2 | 7/2021 | Dankowski et al. |
| 11,217,537 | B2 | 1/2022 | Kong et al. |
| 12,131,916 | B2 * | 10/2024 | Pio .......................... H01L 21/78 |
| 2005/0052706 | A1 | 3/2005 | Nelson |
| 2007/0183624 | A1 | 8/2007 | Davis et al. |
| 2008/0121709 | A1 | 5/2008 | Hayashi et al. |
| 2011/0192894 | A1 | 8/2011 | Ragnet et al. |
| 2017/0242137 | A1 | 8/2017 | Sgiarovello et al. |
| 2017/0243831 | A1 | 8/2017 | Butler et al. |
| 2018/0069710 | A1 | 3/2018 | De Langen et al. |
| 2019/0103297 | A1 * | 4/2019 | Yokoyama ............ H01L 23/544 |
| 2019/0304663 | A1 | 10/2019 | Shimoichi |
| 2019/0304920 | A1 | 10/2019 | Piper |
| 2020/0176507 | A1 | 6/2020 | Hall et al. |
| 2020/0328102 | A1 | 10/2020 | Schepis et al. |
| 2020/0328103 | A1 | 10/2020 | Fulford et al. |
| 2021/0057232 | A1 | 2/2021 | Pio |
| 2021/0057233 | A1 | 2/2021 | Pio |
| 2021/0257225 | A1 | 8/2021 | Pio |
| 2023/0121141 | A1 | 4/2023 | Pio |

OTHER PUBLICATIONS

CN Patent Application No. 202010848284.5—Chinese Search Report, dated Aug. 22, 2024, 4 pages.

Markman, A. et al.; "Photon-Counting Security Tagging and Verification Using Optically Encoded QR Codes"; IEEE Photonics Journal, vol. 6, No. 1, Feb. 2014; (c) 2014 IEEE; 10 pages; DOI: 10.1109/JPHOT.2013.2294625.

Noor, Y. Md et al.; "A Review of the Nd: YAG Laser Marking of Plastic and Ceramic IC Packages"; Journal of Materials Processing Technology 42 (1994); pp. 95-133; 1994 Elsevier Science B.V.

* cited by examiner

54

900

901

Positioning a semiconductor die in a
semiconductor device package

903

Determining a designated area on the first
surface of the semiconductor device
package

905

Forming a pattern in the designated area

SEMICONDUCTOR PACKAGES WITH PATTERNS OF DIE-SPECIFIC INFORMATION

CROSS-REFERENCE TO RELATED APPLICATIONS

This application is a continuation of U.S. patent application Ser. No. 17/307,273, filed May 4, 2021, now U.S. Pat. No. 12,131,916; which is a continuation of U.S. patent application Ser. No. 16/548,126, filed Aug. 22, 2019, now U.S. Pat. No. 11,031,258; each of which is incorporated herein by reference in its entirety.

TECHNICAL FIELD

The present technology is directed to semiconductor packages with patterns of die-specific information. More particularly, some embodiments of the present technology relate to a semiconductor package with a machine-readable pattern thereon for indicating suitable information (such as operation parameters) of a semiconductor die located in the semiconductor package.

BACKGROUND

Packaged semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. To properly operate the semiconductor die, certain die-specific parameters for operating the semiconductor die, such as current, voltage, resistance reference values, etc., must be optimized at die level to account for process variations, for example. Such die-specific parameters are traditionally stored in special non-volatile elements, such as fuses or anti-fuses, that are realized in the die itself. This can be expensive and unreliable.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate, wafer, or die that is singulated from a wafer or substrate. Throughout the disclosure, semiconductor dies are generally described in the context of semiconductor devices but are not limited thereto.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device package assembly" can refer to an assembly that includes multiple stacked semiconductor device packages. As used herein, the terms "vertical," "lateral," "upper," and "lower" can refer to relative directions or positions of features in the semiconductor device or package in view of the orientation shown in the Figures. These terms, however, should be construed broadly to include semiconductor devices having other orientations, such as inverted or inclined orientations.

Figure 1:
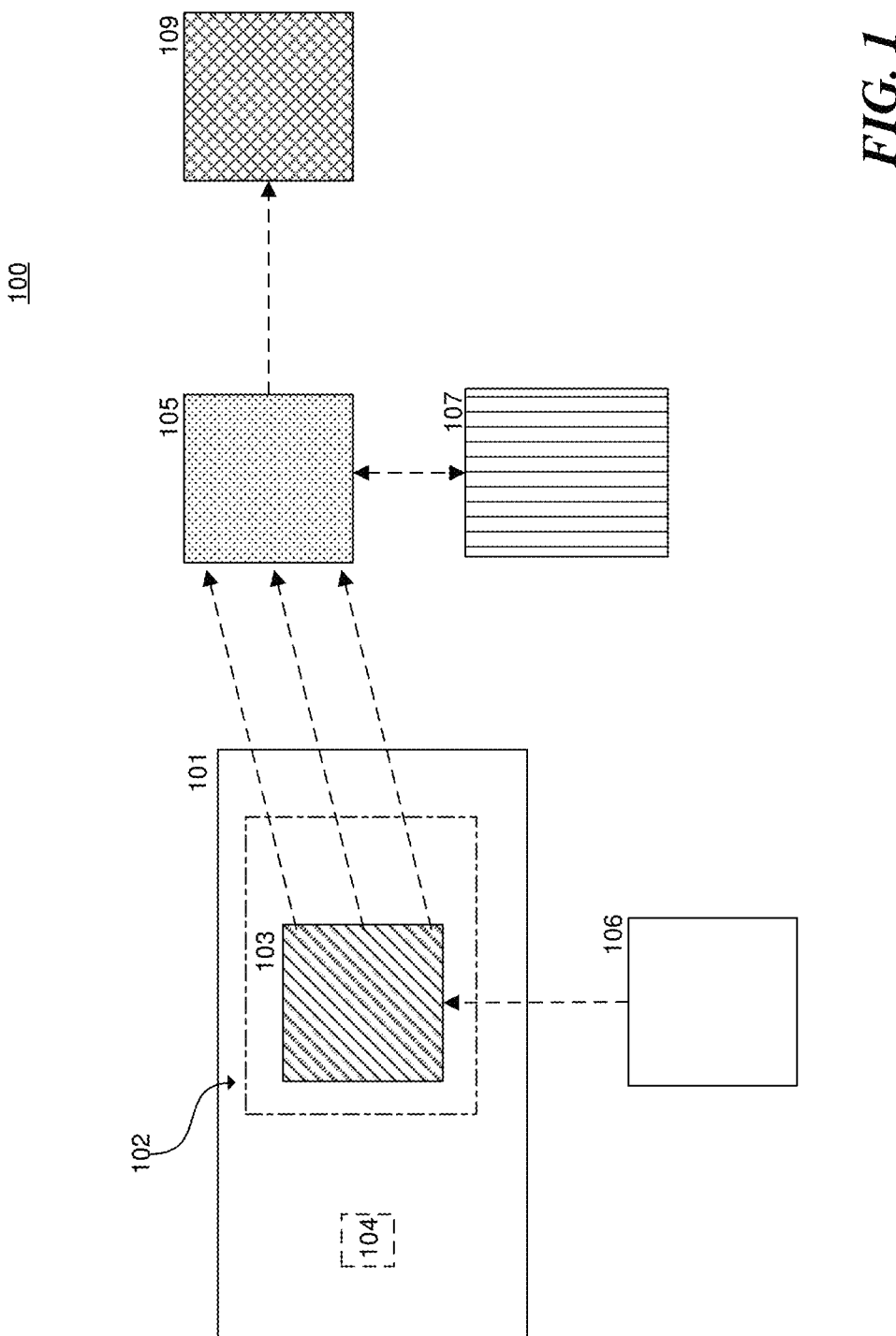
FIG. 1 is a schematic diagram of a system 100 for delivering information by using a pattern on a semiconductor device package in accordance with an embodiment of the present technology.

FIG. 1 is a schematic diagram of a system 100 for delivering information by using a pattern on a semiconductor device package in accordance with an embodiment of the present technology. As shown, the system 100 includes a semiconductor device package 101, a semiconductor die 104 in the semiconductor device package 101, a pattern 103 on an external surface (e.g., a surface that is accessible from the outside) of the semiconductor device package 101, a pattern reader 105 (e.g., an optical reader, a camera, a laser scanner, etc.), a controller 107, and a data storage 109. In some embodiments, the semiconductor device package 101 can be a portion (e.g., the upmost portion) of a semiconductor device package assembly, which includes multiple stacked semiconductor device packages.

As shown in FIG. 1, the semiconductor device package 101 has a designated area 102 for displaying the pattern 103. In some embodiments, the designated area 102 is located at a top surface of the semiconductor device package 101. In some embodiments, the designated area 102 can be located at a bottom surface of the semiconductor device package 101. In some embodiments, the designated area 102 can be located at a side surface of the semiconductor device package 101. In some embodiments, the semiconductor device package 101 can have more than one designated area 102 at different locations (e.g., two different locations at the top surface; one location at the side surface and another location at the bottom surface; one location at the top surface and another location at the bottom surface, etc.).

The pattern 103 is configured to present or deliver suitable information, such as information associated with the semiconductor die 104 in the semiconductor device package 101. The information associated with the semiconductor die 104 can include, for example, suitable current, voltage, voltage adjustments, delays, redundancy information, firmware instructions, power-on/off instructions, etc., for operating the semiconductor die 104. The information associated with the semiconductor die 104 can be used to achieve optimal functionality of the semiconductor die. For example, the information can include a voltage range $V_1$-$V_2$. For example, the information can include trimming parameters for voltages, current generators, and/or regulators. For example, the information can include addresses for redundancy, such as addresses of failing memory locations that can be replaced by functional memory locations. As another example, the information can include a set of instructions that needs to be loaded to a processor to power up and control the semiconductor die 104.

Figure 2:
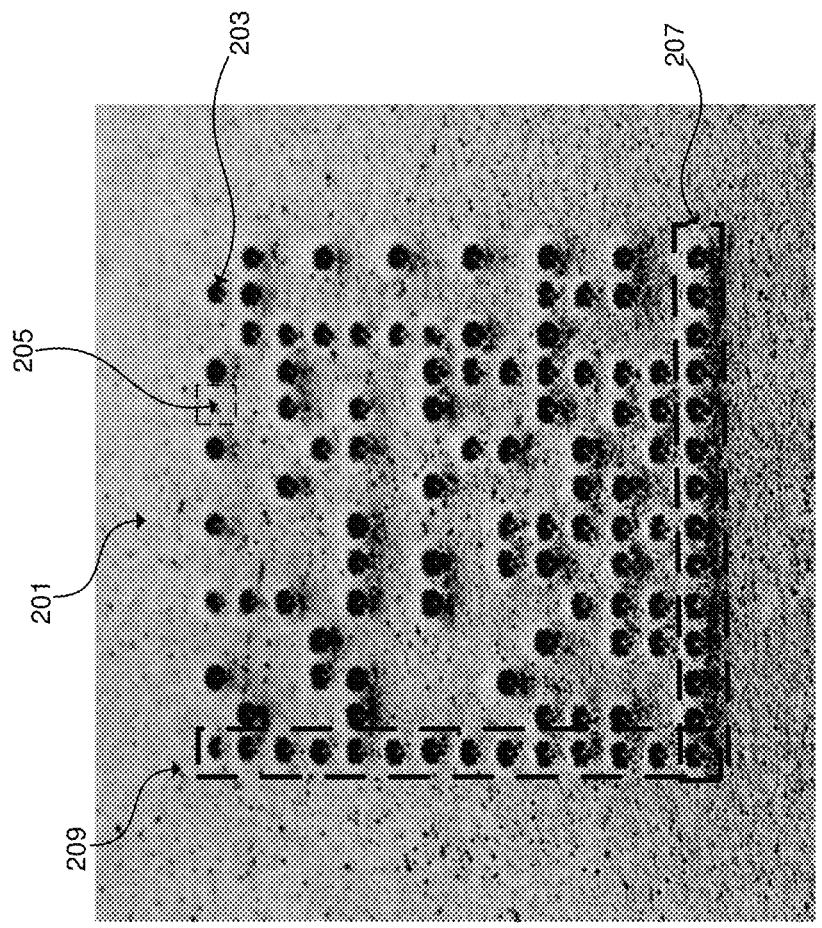
FIG. 2 is an image showing elements in a pattern in accordance with an embodiment of the present technology.

In some embodiments, the pattern 103 can include a combination of dots and spaces (see, e.g., FIG. 2). The dots and the spaces can each represent bit information "1" or "0," such that the combinations of dots and spaces can be used to carry information. In some embodiments, the dots can be created by a laser beam applied to a surface of the semiconductor device package 101. The spaces can be defined by vacant regions adjacent dots. In some embodiments, the dots can overlap one another (see, e.g., FIGS. 3A, 3D, 4A, 4B, 4C and 5A-6A).

In some embodiments, the dots can have a (generally) circular shape. In some embodiments, the dots can have other suitable shapes such as square, rectangle, triangle, ellipse, or irregular shapes. In some embodiments, the dots can be aligned such that the pattern reader 105 can read the dots (and recognize the spaces therebetween) in a specific direction or along a particular path or route (e.g., a serpentine line). In some embodiments, the pattern 103 can be positioned or formed on the semiconductor device package 101 by a printing process (e.g., a laser printing process). In some embodiments, the pattern 103 can be positioned or formed on the semiconductor device package 101 by stamping, etching, engraving, laser, thermal molding, applying an adhesive, etc.

The pattern reader 105 is configured to scan, read, and/or recognize the dots and spaces of the pattern 103. In some embodiments, the pattern reader 105 can be an optical scanner (e.g., using visible light, infrared radiation (IR), or other suitable wavelengths). In some embodiments, the pattern reader 105 can be a camera. In some embodiments, the pattern reader 105 can be a laser scanner. The pattern reader 105 can be coupled to and controlled by the controller 107. For example, the controller 107 can instruct the pattern reader 105 to initiate a reading/recognizing process to read and analyze the pattern 103 and accordingly obtain the information associated with the pattern 103. The information associated with the semiconductor die 104 can be sent to the data storage 109 for future use.

In some embodiments, the data storage 109 can be a storage device or a disk drive coupled to the pattern reader 105. In some embodiments, the data storage 109 can be a database communicably coupled to the pattern reader 105 (e.g., via a wired or wireless network such as the Internet or an intranet).

In some embodiments, at least a portion of the information associated with the pattern 103 can be stored in a non-volatile component (e.g., a fuse, a non-volatile memory, etc.) of the semiconductor device package 101. In the embodiments where the information is stored in fuses, the semiconductor device package 101, during a power-on process, will retrieve the information by reading it from the fuses and copy it into a component (e.g., a configuration latch, which provides safe access) of the semiconductor device package 101.

In some embodiments, the information associated with the pattern 103 can be encrypted for security purposes. In some embodiments, to decode the encrypted information associated with the pattern 103, a set of instructions regarding how to read/recognize the pattern 103 (e.g., row by row, column by column, a continuous path, the sizes of dots and spaces, etc.) may be required. By this arrangement, the present technology provides a secured way to deliver suitable information by the pattern 103 such that only authorized operators/users/customers can access the encrypted information associated with the pattern 103.

In some embodiments, the semiconductor die 104 can be tested for functionality, for example, during an Electrical Wafer Sorting (EWS) test. During the test, a set of optimal operation/working parameters can be determined, such as trimming parameters for voltage/current generators and regulators, addresses for memory cell redundancy, etc. The set of optimal operation/working parameters can be stored in the data storage 109 and/or controlled by the controller 107. In some embodiments, a writing apparatus 106 can be configured to form the pattern 103 in the designated area 102 of the semiconductor device package 101, after the semiconductor device package 101 has been packed. For example, the pattern 103 can include one or more one-dimensional and/or two-dimensional codes. In other words, the die-specific information associated with the semiconductor die 104 can be encoded and written on its package for future use, as described above.

In some embodiments, the information associated with the pattern 103 can include customized information requested by a user. For example, the user can request a manufacturer of the semiconductor device package 101 to add information in the pattern 103, and such information can include, for example, internal batch/reference numbers provided by the user, technical notes regarding how to operate the semiconductor device package 101 created by the user, versions of the firmware in the semiconductor die, and the like. By this arrangement, the present technology enables a user to add inherent, customized information in the pattern 103.

FIG. 2 shows an image of elements of a pattern 201 in accordance with an embodiment of the present technology. As shown, the pattern 201 includes a matrix including multiple dots 203 and multiple spaces 205 void of a dot 203 (e.g., having only vacant regions). The spaces 205, for example, may be among or defined by the dots 203. In the illustrated embodiments, a pattern reader can recognize a dot 203 as bit information "1" and a space 205 as bit information "0." The pattern 201 also includes a horizontal reference line 207 and a vertical reference line 209 configured to indicate the boundaries of the pattern 201. For example, the vertical reference line 209 can indicate a starting location for each row of the pattern 201 when the pattern reader reads the dots 203/spaces 205 in each row of the pattern 201. In some embodiments, the horizontal reference line 207 can indicate an ending location for each column of the pattern 201 when the pattern reader reads the dots 203/spaces 205 in each column of the pattern 201. By reading through the pattern 201, the pattern reader can obtain information carried by the pattern 201.

In the embodiment illustrated in FIG. 2, each of the dot 203 and space 205 (void of a dot 203) represents one bit of die-specific information. For example, it can represent one bit of an address of a failing memory cell at a location in a semiconductor die that needs to be replaced by a functioning memory cell at a different location (e.g., the bit can be part of an address to be used for redundancy). In another embodiment, the dots 203 and spaces 205 can represent trimming-parameter bits that are used for adjusting/fine-tuning the operation of an internal circuit of the semiconductor die.

Figure 3A:
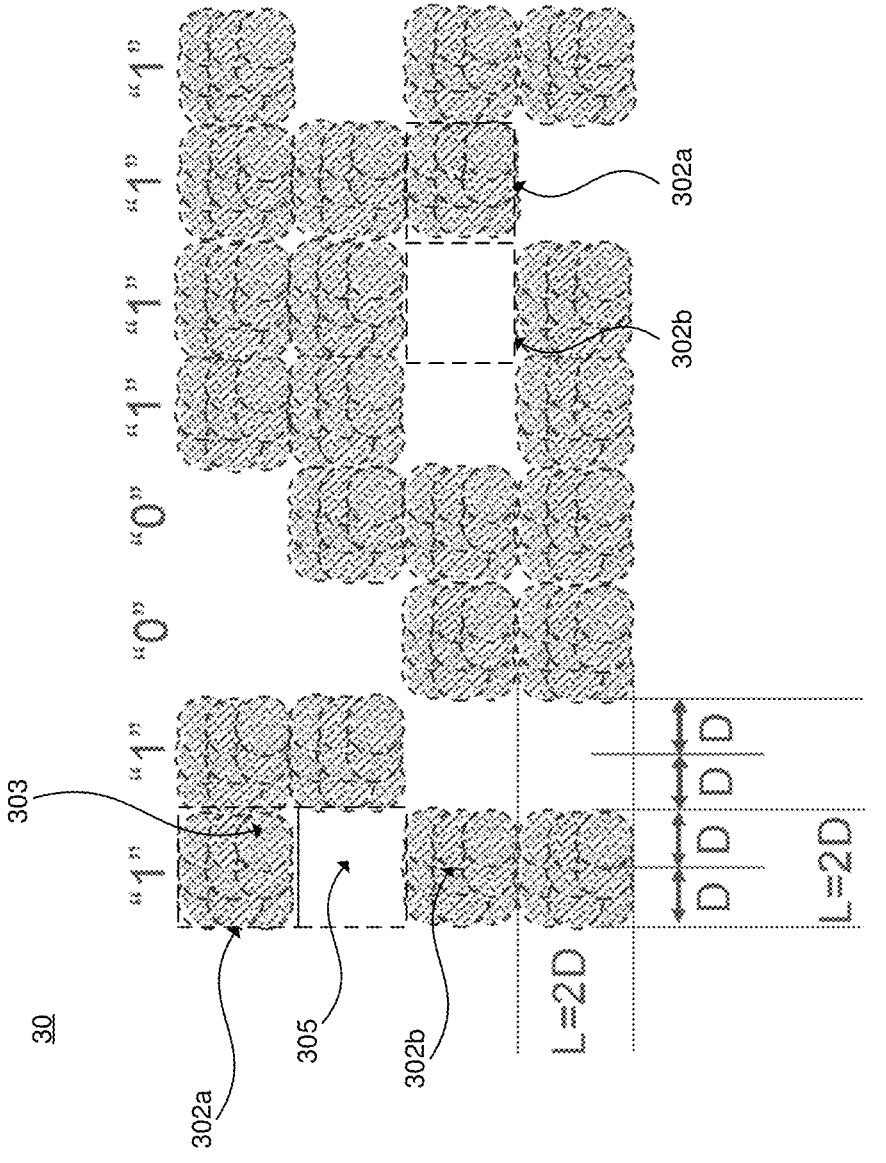
FIGS. 3A-3E are schematic diagrams illustrating methods for encoding/decoding in accordance with embodiments of the present technology.

FIGS. 3A-3E are schematic diagrams illustrating methods for encoding/decoding in accordance with an embodiment of the present technology. FIG. 3A shows a pattern 30 having first bit areas 302a and second bit areas 302b. In the illustrated embodiment, each bit area 302a-b has a square shape. In other embodiments, the bit areas 302a-b can have other suitable shapes. As shown, the first bit areas 302a can include multiple dots 303 that overlap one another, and the second bit areas 302b are spaces 305 without dots 303. The first bit areas 302a with the dots 303 represent bit information "1" and the second bit areas 302b defining the space 305 represent bit information "0." Accordingly, the first row (left to right) of the pattern 30 represents "11001111," the second row (left to right) of the pattern 30 represents "01011110," and so forth. In the illustrated embodiments, the dots 303 have a diameter D, and accordingly a length L of the first bit area 302a with nine dots 303 can be "2D" (in FIG. 3A, adjacent dots partly overlap to substantially fill the first bit area 302a, in embodiments where adjacent dots are formed with more overlapping, there can be more than 9 dots to form the first bit area 302a with the same length L). In the illustrated embodiment, an effective bit area "$L^2$" of the pattern 30 is equal to "$4D^2$" (2D*2D). In some embodiments, the effective bit area "$L^2$" can be reduced to "$D^2$" when the length L equals to "D." The effective bit area of a pattern corresponds to a data density (e.g., bits per square millimeter; bit/mm²) of that pattern. In other words, a pattern with a higher effective bit area has a lower data density. In some embodiments, diameter D of the individual dots 303 can be 5-30 μm. In some embodiments, diameter D of the individual dots 303 can be about 10 μm. In some embodiments, diameter D of the individual dots 303 can be about 20 μm.

Figure 3B:
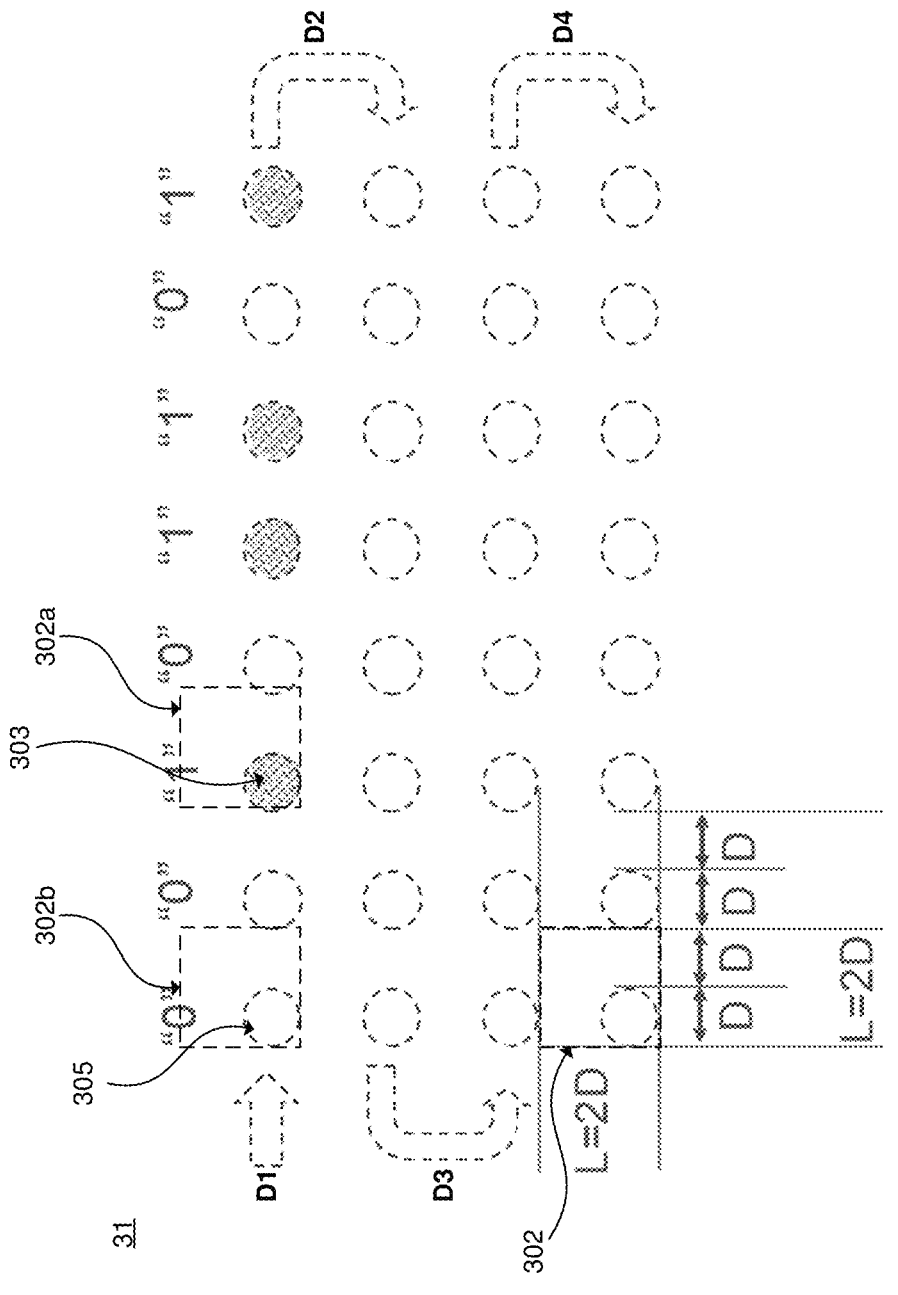

FIG. 3B shows a pattern 31 having multiple first and second bit areas 302a-b. In the illustrated embodiment, the bit areas 302a-b have a square shape. In other embodiments, however, the bit areas 302a-b can have other suitable shapes. As shown, the first bit areas 302a can include one dot 303 in one region (e.g., one quadrant) and vacant regions (e.g., three quadrants) in the other portions that together form a square bit area. In the second bit areas 302b, all of the regions in the bit area can be vacant (e.g., four vacant or empty quadrants) to define a space 305. The first bit areas 302a having a dot 303 represent bit information "1" and the second bit areas 302b defined by the space 305 represent bit information "0." Accordingly, the first row (left to right) of the pattern 31 represents "00101101." In the illustrated embodiment, a pattern reader can read the pattern 31 following the order of: direction $D_1$, direction $D_2$, direction $D_3$, and direction $D_4$. In the illustrated embodiment, the bit areas 302a-b in the second, third, and fourth rows each represent bit information "0." In the illustrated embodiments, the dot 303 has a diameter D, and accordingly a length L of the bit areas 302a-b can be "2D." In the illustrated embodiment, an effective bit area "$L^2$" is equal to "$4D^2$" (2D*2D). In some embodiment, the effective bit area "$L^2$" can be reduced to "$D^2$" when the length L equals to "D." The pattern 30 discussed in FIG. 3A and the pattern 31 discussed in FIG. 3B have the same effective bit area "$4D^2$."

Figure 3C:
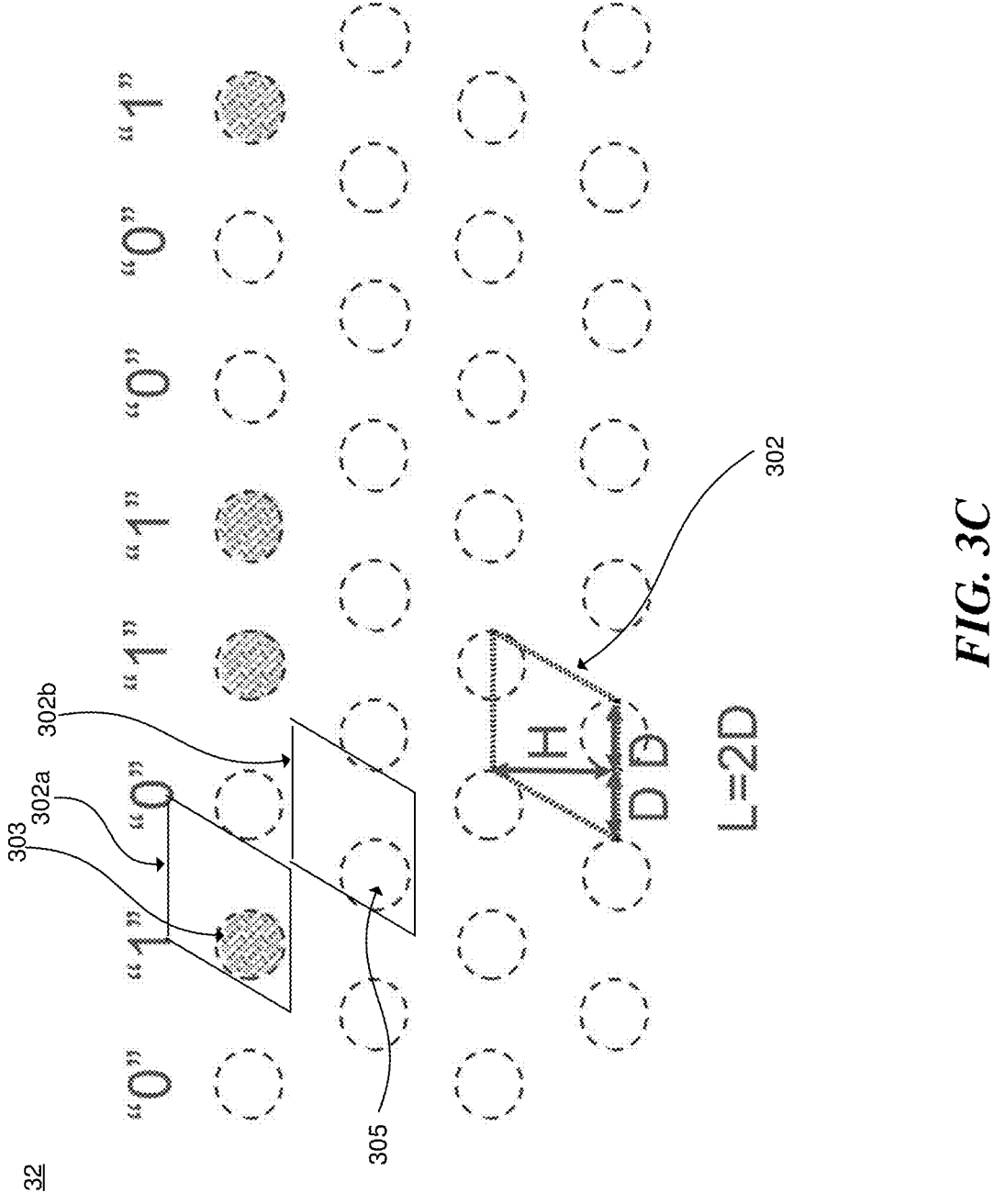

FIG. 3C shows a pattern 32 with parallelogram (e.g., diamond-shaped) bit areas 302a-b. In the illustrated embodiment, each dot 303 has a diameter D, and accordingly a length L of each bit area 302a-b can be "2D." A height H of the bit area 302a-b is "$\sqrt{3}/2\times2D$." Accordingly, the effective area of each bit area 302a-b in the pattern 32 is "L×H," which equals to "$(2D\times(\sqrt{3}/2\times2D))$" or "$3.46D^2$."

The pattern 32 has a smaller effective bit area than those of the pattern 30 (FIG. 3A) and the pattern 31 (FIG. 3B) and thus a higher data density. Similar to the embodiments discussed in FIGS. 3A and 3B, the first bit areas 302a with a dot 303 represent bit information "1" and the second bit areas 302b with a space 305 represent bit information "0." Accordingly, the first row (left to right) of the pattern 32 represents "01011001." In the illustrated embodiment, the bit areas 302a-b in the second, third, and fourth rows each represent bit information "0."

Figure 3D:
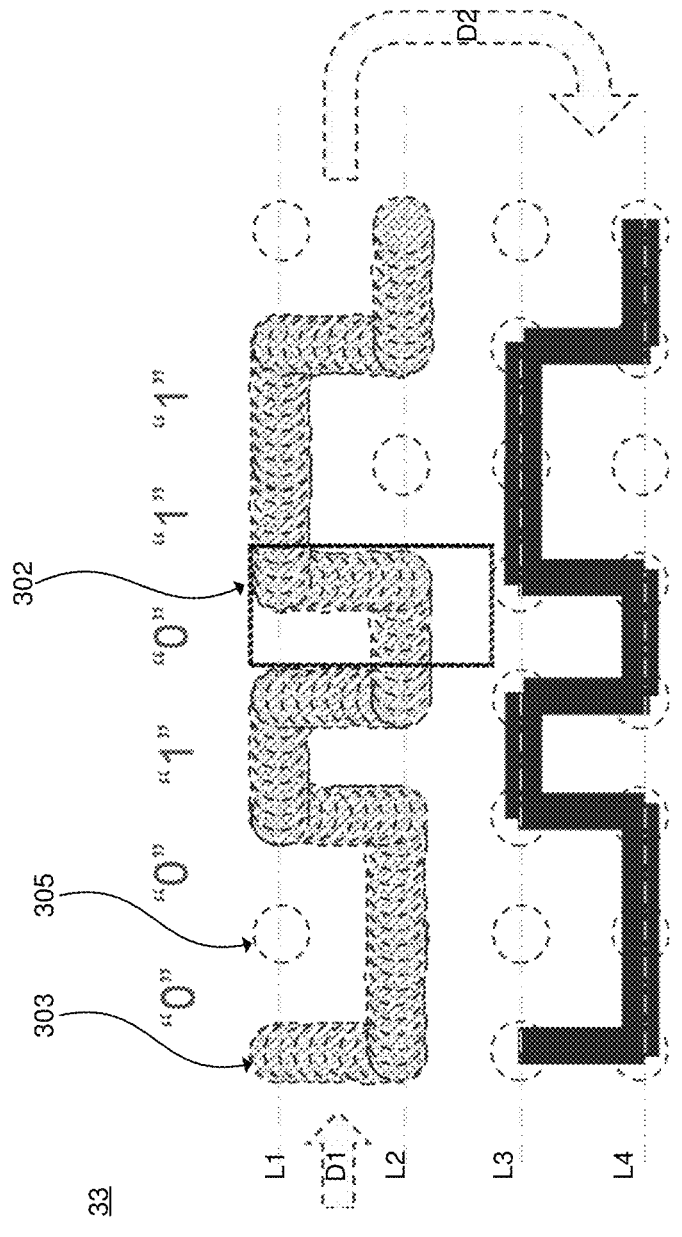
Figure 3E:
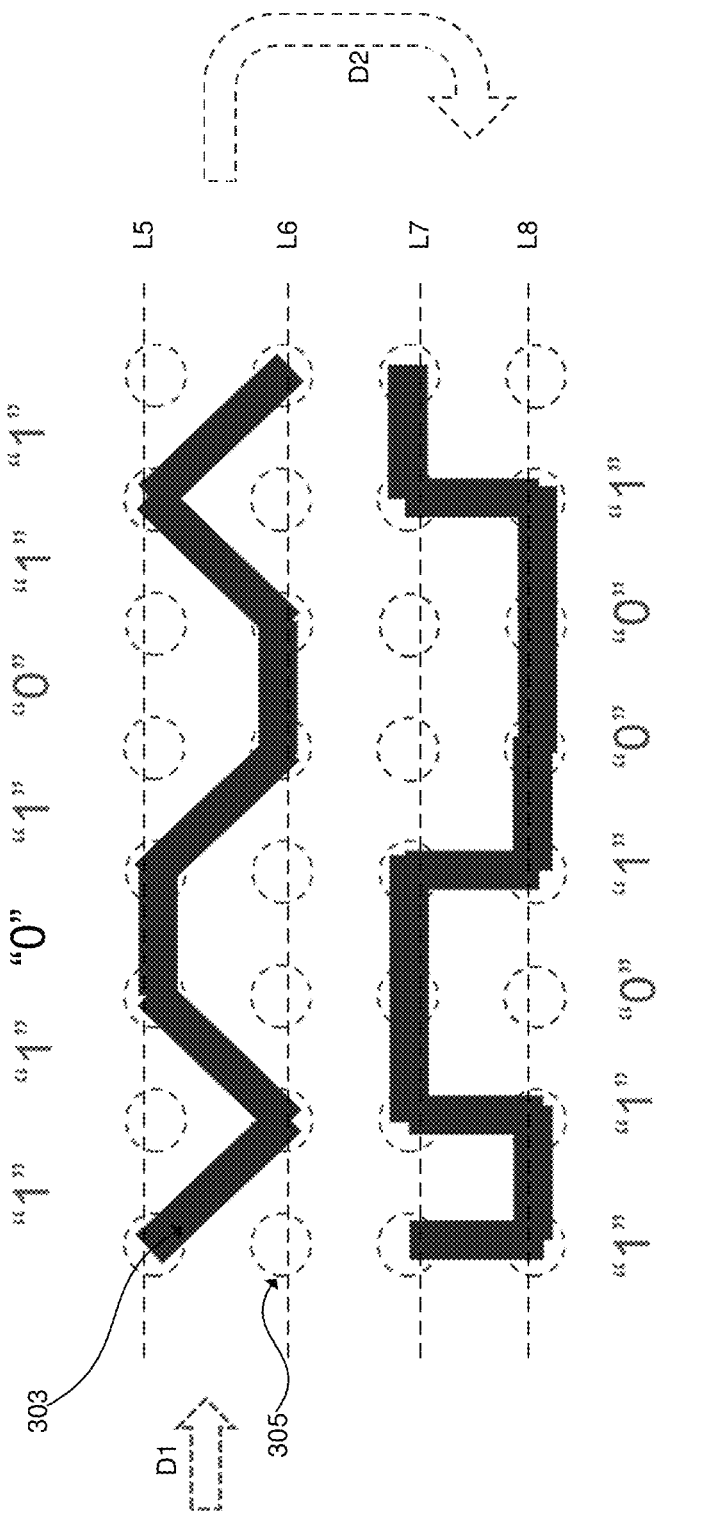

FIGS. 3D and 3E illustrate patterns that "toggle" between representing bit information "1" and bit information "0." In FIG. 3D, a pattern 33 has multiple dots 303 and spaces 305 arranged along two lines $L_1$, $L_2$. The pattern reader reads lines $L_1$ and $L_2$ in a direction $D_1$ and recognizes when the dots 303 change (e.g., "toggle") between the two lines $L_1$, $L_2$. For example, when the dots 303 are in line $L_1$, the pattern reader reads bit information "1." Otherwise, when the dots 303 are in Line $L_2$ or moving between lines $L_1$ and $L_2$, the pattern reader reads bit information "0." The pattern reader can then read, in direction $D_2$ (right to left), two lines $L_3$, $L_4$ in the same manner. In the illustrated embodiment, each bit area 302 has a rectangular shape. The individual dots 303 can have a diameter D, and accordingly the effective bit area of the bit area 302 in the pattern 33 can be "2D×4D" or "$8D^2$."

In FIG. 3E, a pattern 34 has multiple lines 303 (e.g., formed by multiple dots) and spaces 305. The pattern reader can read the two lines $L_5$ and $L_6$ in direction D1 at one time and then lines $L_7$ and $L_8$ in direction D2 in the manner described above with respect to FIG. 3D. In FIG. 3E, two different schemes of toggle encoding are depicted. First, bit information "1" is represented by a segment diagonally switching lines (e.g., from $L_5$ to $L_6$ or from $L_6$ to $L_5$ (top), or vertically switching lines (e.g., from $L_7$ to $L_5$ or from $L_5$ to $L_7$ (bottom). Second, bit information "0" is represented by horizontal segments staying in the same line (e.g., staying in $L_5$, $L_6$, $L_7$, or $L_8$). The effective bit area in the pattern 34 is also "2D×4D" or "$8D^2$." The effective bit areas in the patterns 33 and 34 have a lower density than those of the patterns 30-32. The present technology provides various patterns, which can be used based on multiple factors such as the resolution of the pattern reader, available space for the patterns, amount of the information to be carried by the patterns, etc.

Figure 4A:
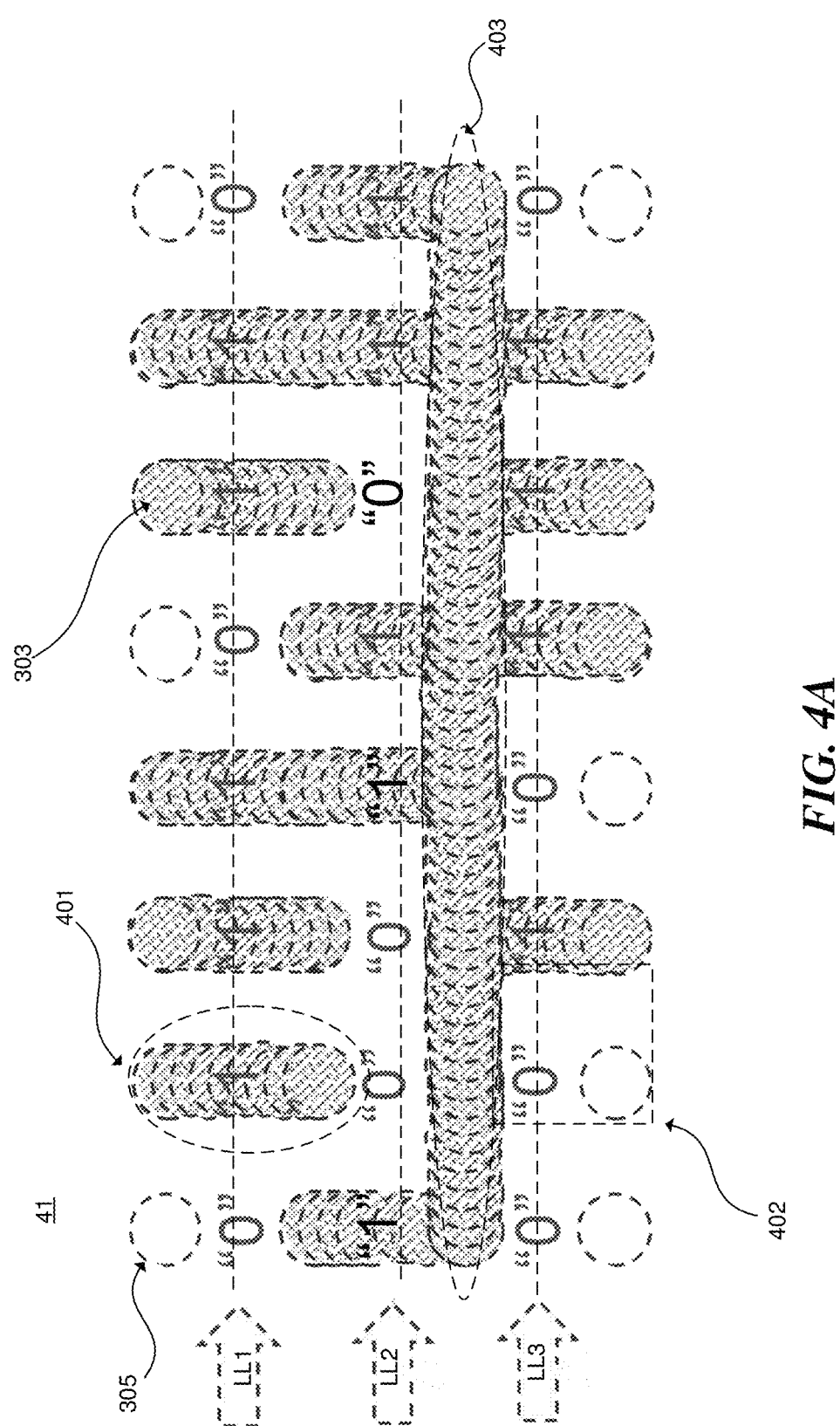
FIGS. 4A-4C are schematic diagrams illustrating methods for encoding/decoding by using segments in accordance with embodiments of the present technology.
Figures 4B, 4C:
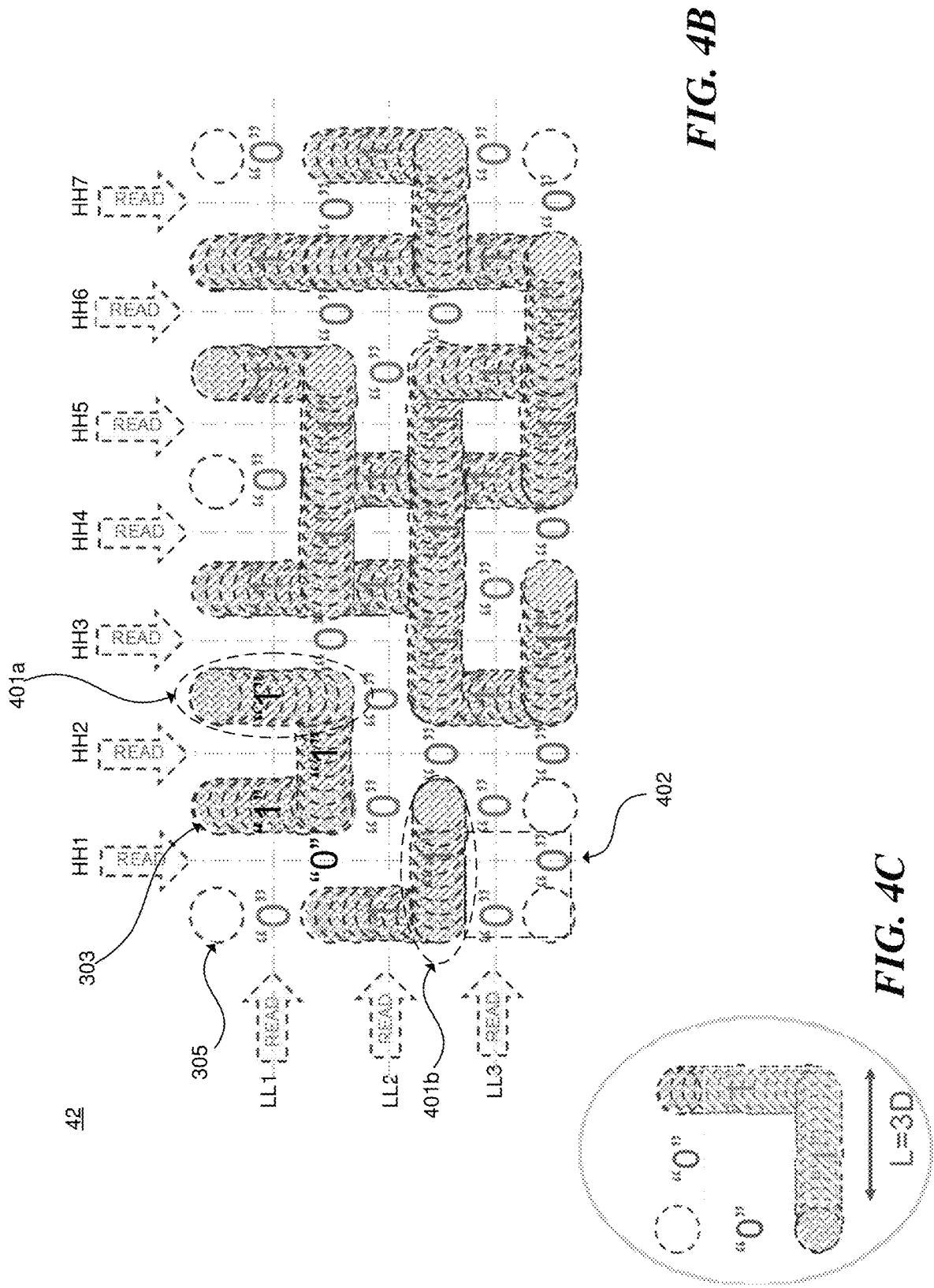

FIGS. 4A-4C are schematic diagrams illustrating methods for encoding/decoding by using segments in accordance with an embodiment of the present technology. In FIG. 4A, a pattern 41 has multiple dots 303 and spaces 305. The pattern reader can read, in direction $LL_1$ (left to right) and recognize a segment 401 (or a line) formed by a portion of the multiple dots 303. When the pattern reader reads the segment 401, it represents bit information "1." When the pattern reader reads the space 305, it represents bit information "0." As a result, the reading of line $LL_1$ can be "01110110." After finishing reading line $LL_1$, the pattern reader can then read lines $LL_2$ (left to right) and $LL_3$ (left to right) in the same manner. In the illustrated embodiment, the reading of line LL$_2$ can be "10011011," and the reading of line LL$_3$ can be "00101110." The pattern 41 can include a reference line 403 configured to indicate a starting line, an ending line, or other suitable references for the pattern reader. In the illustrated embodiment, a bit area 402 has a square shape. Each dot 303 has a diameter D, and accordingly the effective bit area in the pattern 41 is "2D×2D" or "4D$^2$."

In FIG. 4B, a pattern 42 has multiple dots 303 and spaces 305. The pattern reader can read, in direction LL$_1$ (left to right), and recognize a vertical segment 401a (or a line) formed by multiple dots 303. When the pattern reader reads the segment 401a, it represents bit information "1." When the pattern reader reads the space 305, it represents bit information "0." As a result, the reading of line LL$_1$ can be "01110110." After finishing reading line LL$_1$, the pattern reader can then read lines LL$_2$ (left to right) and LL$_3$ (left to right), one by one, in the same manner. In the illustrated embodiment, the reading of line LL$_2$ can be "10011011," and the reading of line LL$_3$ can be "00101110."

Referring to FIG. 4B, the pattern reader can further read, in direction HH$_1$ (top to bottom) and recognize a horizontal segment 401b (or a line) formed by multiple dots 303. When the pattern reader reads the segment 401b, it represents bit information "1." When the pattern reader reads the space 305, it represents bit information "0." As a result, the reading of line HH$_1$ can be "010." After finishing reading line HH$_1$, the pattern reader can then read lines HH$_2$-HH$_7$ (top to bottom) in the same manner. In the illustrated embodiment, the reading of lines HH$_2$-HH$_7$ can be "100," "011," "110," "111," "001," and "010."

In the embodiment of FIG. 4B, the bit area 402 has a square shape. Each dot 303 has a diameter D, and accordingly the effective bit area in the pattern 42 is "2D×2D/2" or "2D$^2$." In some embodiments, the size of the bit area 402 can have a length L equal to "3D," as shown in FIG. 4C, which can be calculated by adding line "D" plus two spaces "2D". Accordingly, the effective bit area in the pattern 42 can be "3D×3D/2" or "4.5D$^2$." The reason that "3D×3D" is divided by "2" is because the pattern 42 provides two dimensions of data reading (e.g., directions LL and HH), which double the data density of the pattern 42.

Figure 5A:
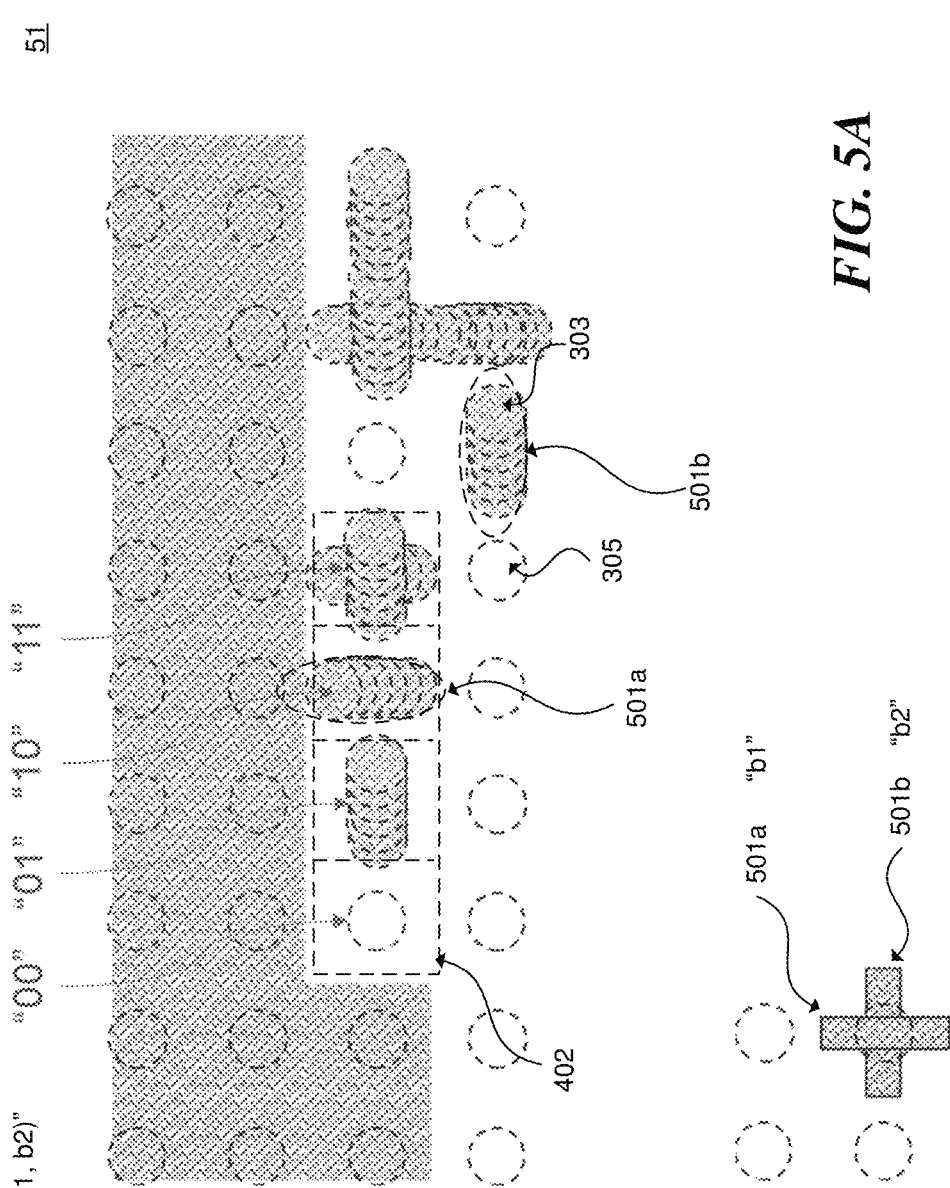
FIGS. 5A-5D are schematic diagrams illustrating methods for encoding/decoding by using segments in accordance with embodiments of the present technology.

FIGS. 5A-5D are schematic diagrams illustrating methods for encoding/decoding by using segments in accordance with an embodiment of the present technology. In FIG. 5A, a pattern 51 can include multiple segments 501a-b (formed by multiple dots 303) and spaces 305. The segments 501a-b can be vertical segments 501a or horizontal segments 501b. The vertical segments 501a and the horizontal segments 501b correspond to a pair of data "b1, b2" (which has two "data dimensions") in each bit area 402 of the pattern 51. More particularly, when the pattern reader recognizes the vertical segment 501a in the bit area 402, it represents bit information "1" at "b1." When the pattern reader does not read the vertical segment 501a in the bit area 402, it represents bit information "0" at "b1."

Similarly, when the pattern reader recognizes the horizontal segment 501b in the bit area 402, it represents bit information "1" at "b2." When the pattern reader does not read the horizontal segment 501b in the bit area 402, it represents bit information "0" at "b2." By this arrangement, the data density of the pattern 51 can be doubled compared to the embodiments where only one "data dimension" is used (e.g., it only has "b1" or "b2," but not both).

Figure 5B:
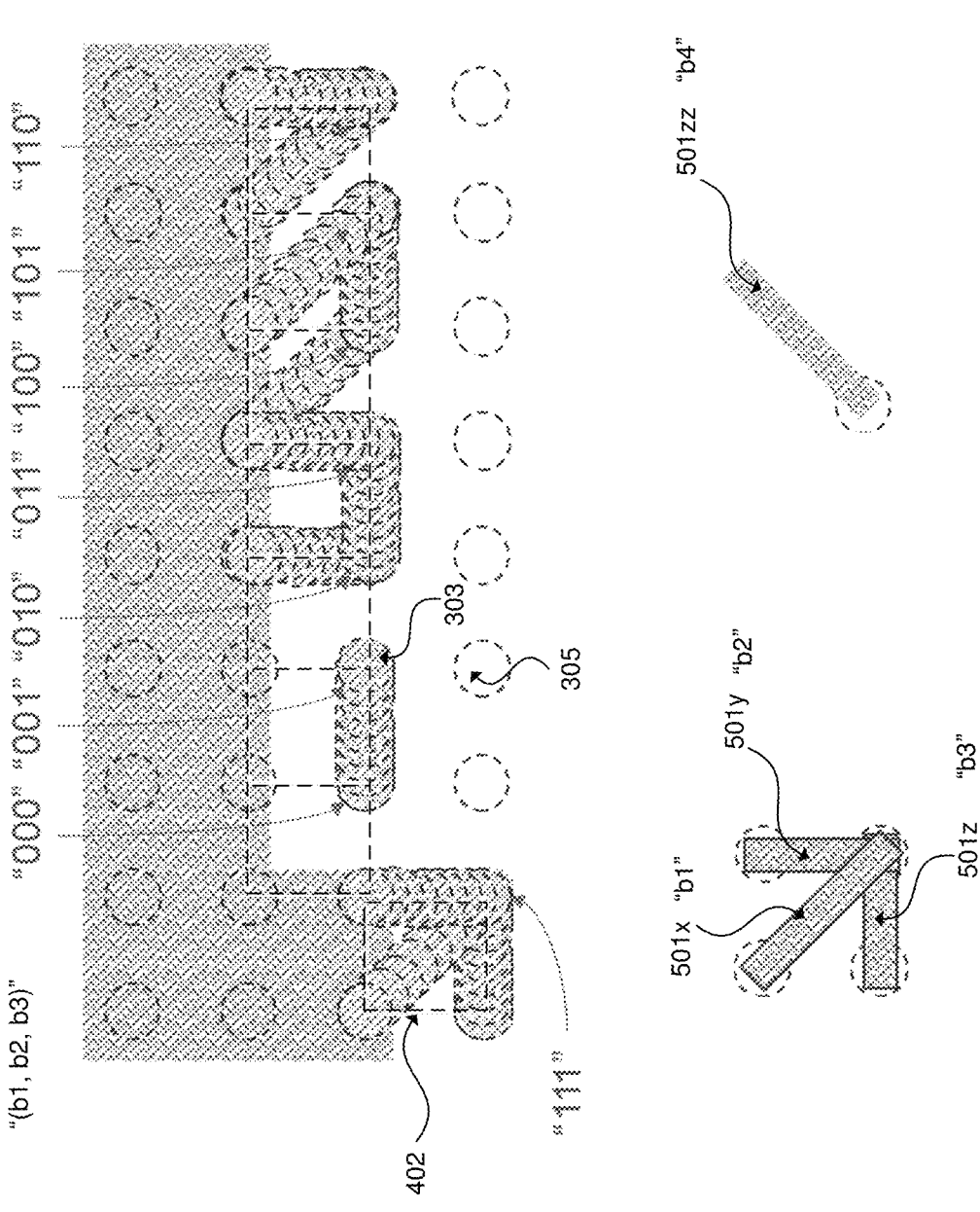

In FIG. 5B, a pattern 52 can include multiple segments 501 (formed by multiple dots 303) and spaces 305. In the illustrated embodiment, the segment 501 can be a (first)

diagonal segment 501x, a vertical segment 501y, or a horizontal segment 501z. The segments 501x, 501y, and 501z correspond to a dataset "b1, b2, b3" (which has three data dimensions) in each bit area 402 of the pattern 52. When the pattern reader recognizes the diagonal segment 501x in the bit area 402, it represents bit information "1" at "b1." When the pattern reader does not read the diagonal segment 501x in the bit area 402, it represents bit information "0" at "b1."

Similarly, when the pattern reader recognizes the vertical segment 501y in the bit area 402, it represents bit information "1" at "b2." When the pattern reader does not read the vertical segment 501y in the bit area 402, it represents bit information "0" at "b2." Likewise, when the pattern reader recognizes the horizontal segment 501z in the bit area 402, it represents bit information "1" at "b3." When the pattern reader does not read the horizontal segment 501z in the bit area 402, it represents bit information "0" at "b3." By this arrangement, the data density of the pattern 52 can be tripled compared to the embodiments where only one data dimension is used.

Referring to FIG. 5B, in some embodiments, the dataset can have four data dimensions. Namely, the dataset can be "b1, b2, b3, b4" in each bit area 402 of the pattern 52. A second diagonal segment 501zz can be added to the embodiments discussed above. The second diagonal segment 501zz corresponds to the fourth data dimension "b4." When the pattern reader recognizes the second diagonal segment 501zz in the bit area 402, it represents bit information "1" at "b4." When the pattern reader does not read the second diagonal segment 501zz in the bit area 402, it represents bit information "0" at "b4." By this arrangement, the data density of the pattern 52 can be quadrupled compared to the embodiments where only one data dimension is used.

Figure 5C:
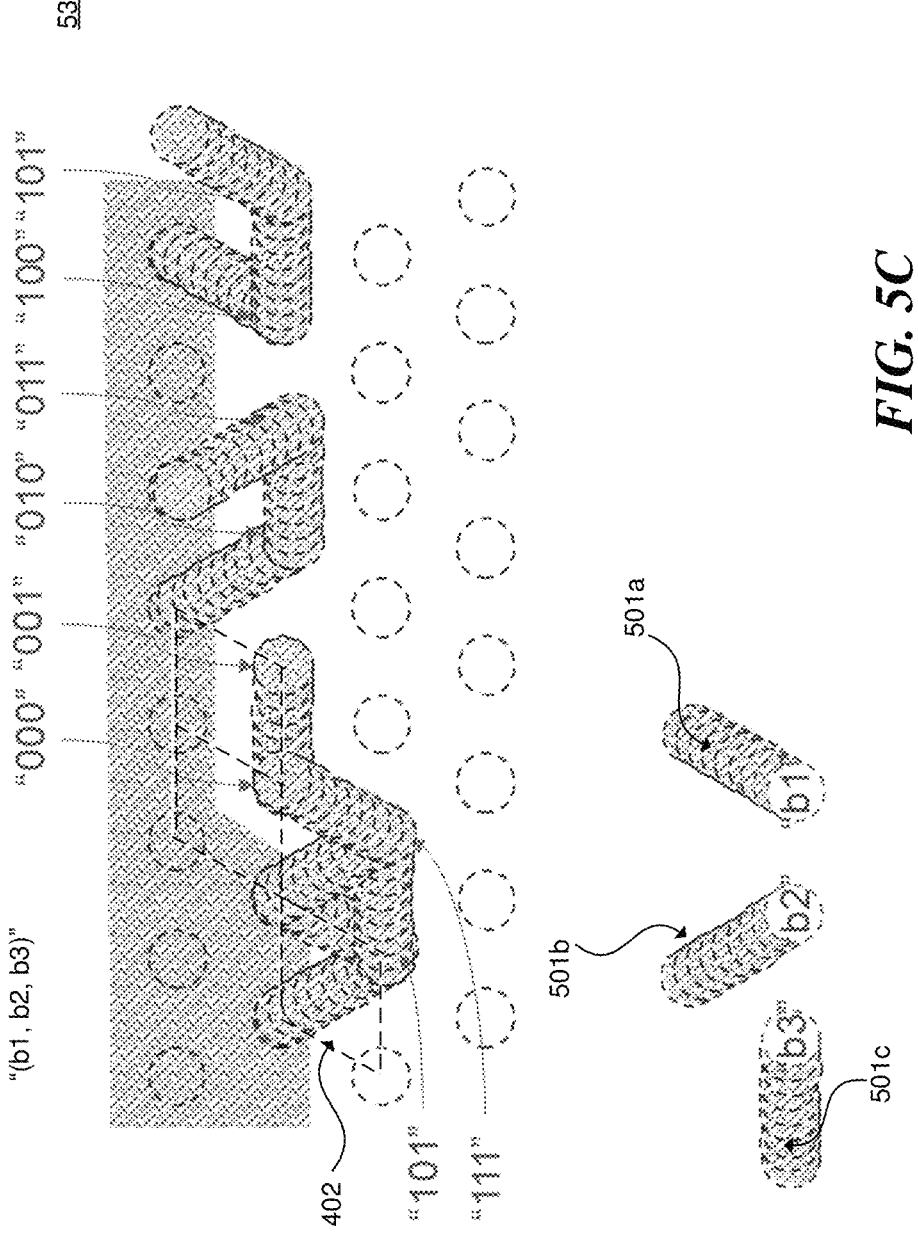

FIG. 5C illustrates a pattern 53 involving three data dimensions. The pattern 53 has a bit area 402 with a parallelogram shape. Accordingly, the segment 501 of the pattern 53 can be a partially vertical segment 501a, a diagonal segment 501b, or a horizontal segment 501c. The segments 501a, 501b, and 501c correspond to a dataset "b1, b2, b3" (e.g., three data dimensions) in each bit area 402 of the pattern 53.

Figure 5D:
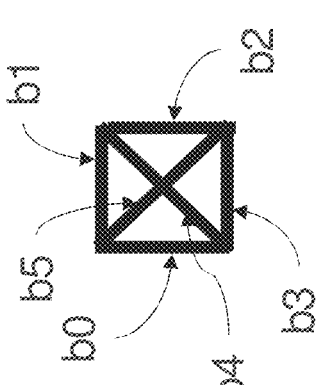
Figure 5D:
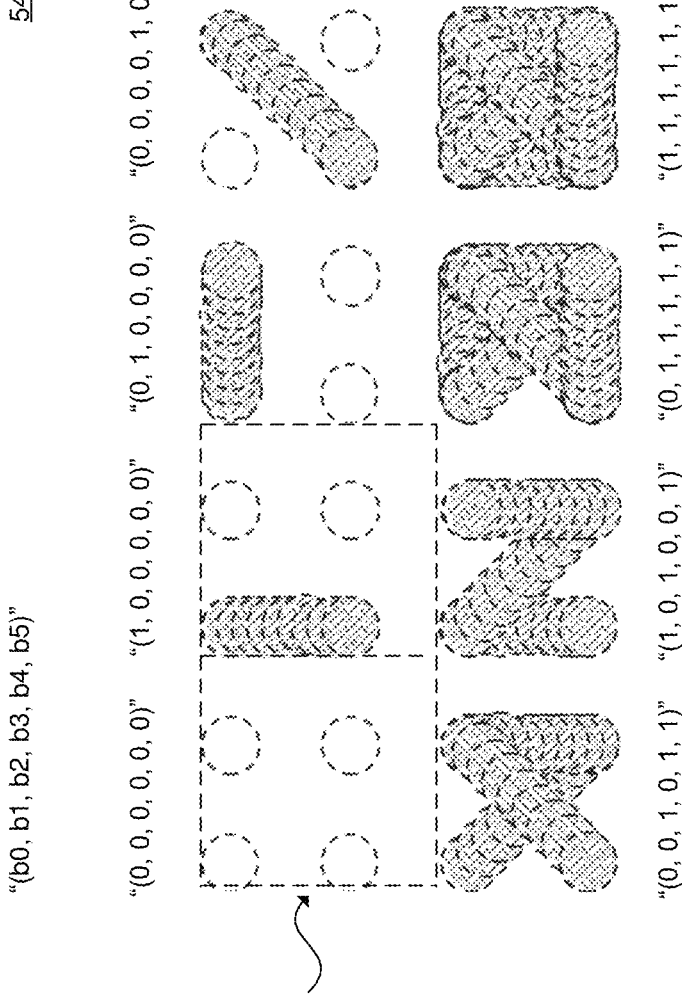

FIG. 5D illustrates a pattern 54 involving six data dimensions. For example, the pattern 53 has a bit area 402 with a square shape. Each bit area 402 can include six segments (four sides and two diagonals). These six segments correspond to a dataset "b0, b1, b2, b3, b4, b5" which has six data dimensions. By this arrangement, the data density of the pattern 54 can be sextupled (six times) compared to the embodiments where only one data dimension is used.

Figure 6A:
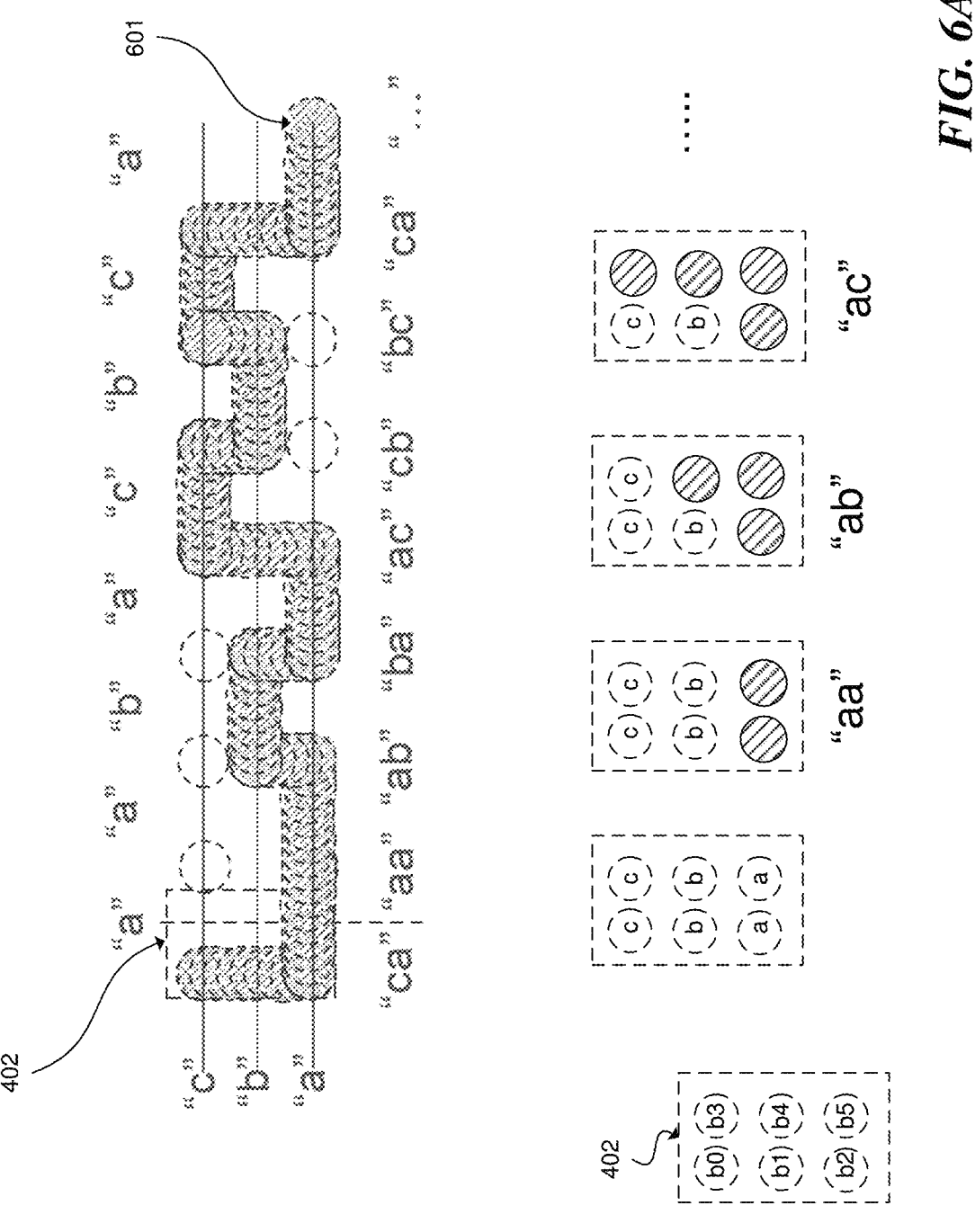
FIGS. 6A-6B are schematic diagrams illustrating methods for encoding/decoding in accordance with embodiments of the present technology.

FIG. 6A shows a schematic diagram of methods for encoding/decoding in accordance with an embodiment of the present technology. In FIG. 6A, a pattern 61 has a bit area 402 with six data dimensions (b0-b5). In some embodiments, the pattern 61 can be configured to provide two sets of vertical values (e.g., a, b, or c). by this arrangement, the pattern 61 can provide 9 combinations of values, such as "aa," "ab," "ac," "ba," "bb," "bc," "ca," "cb," and "cc." The pattern 61 can be formed conveniently by a continuous line 601 (e.g., made of multiple laser dots).

Figure 6B:
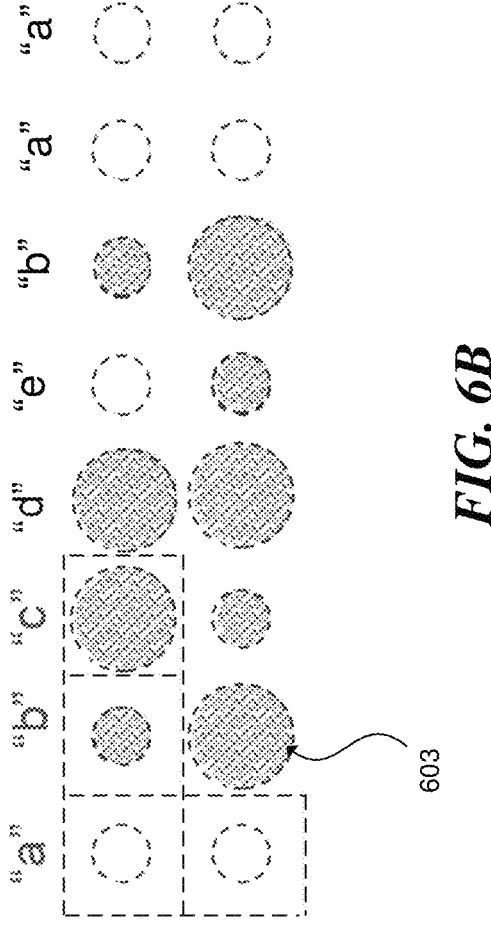

FIG. 6B are schematic diagrams illustrating methods for encoding/decoding in accordance with an embodiment of the present technology. As shown in FIG. 6B, the size of a dot 603 as well as the presence of the dot 603 can both be used as factors to represent different values in a pattern. For example, two vacant regions can represent value "a," one small dot and one large dot can represent value "b" or "c"

(e.g., when the small dot is at the top, the value is "b," and when the small dot is at the bottom, the value is "c."), two large dots can represent value "d," one small dot and a space can represent value "e," and so on. Although the embodiment in FIG. 6B only shows dots with two different seizes, in other embodiments, the dots can have more than two different sizes, allowing for an increased number of permutations and combinations of symbols.

Figure 7A:
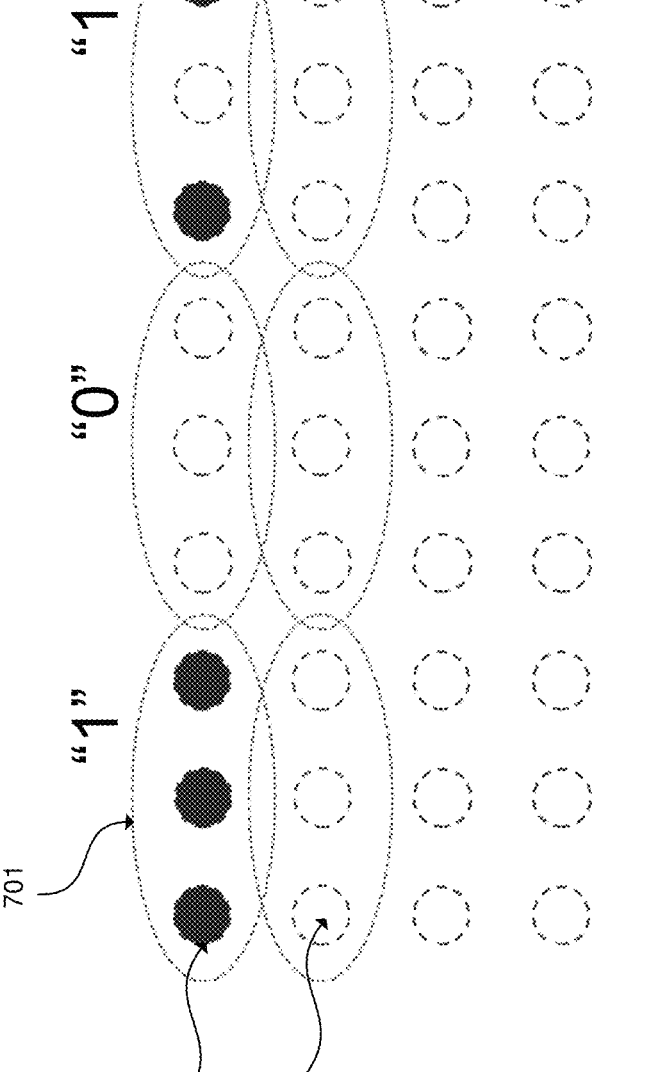
FIGS. 7A-7C are schematic diagrams illustrating methods for encoding/decoding in accordance with an embodiment of the present technology.
Figure 7B:
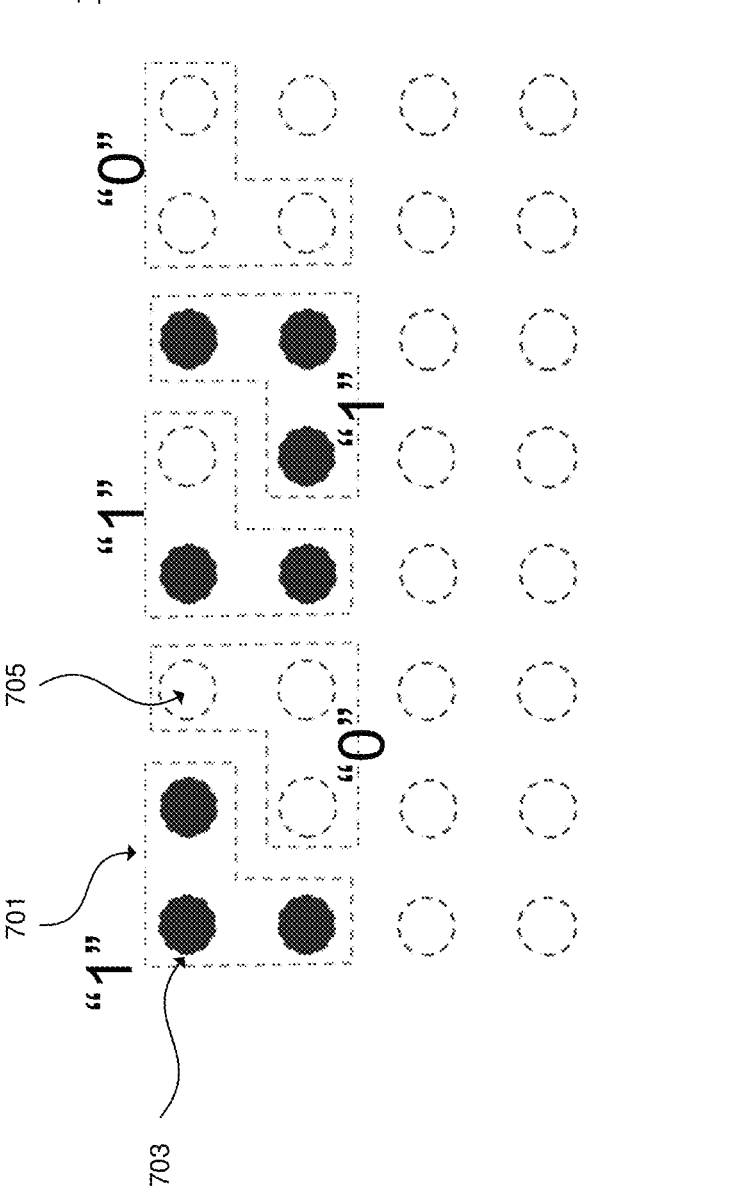
Figure 7C:
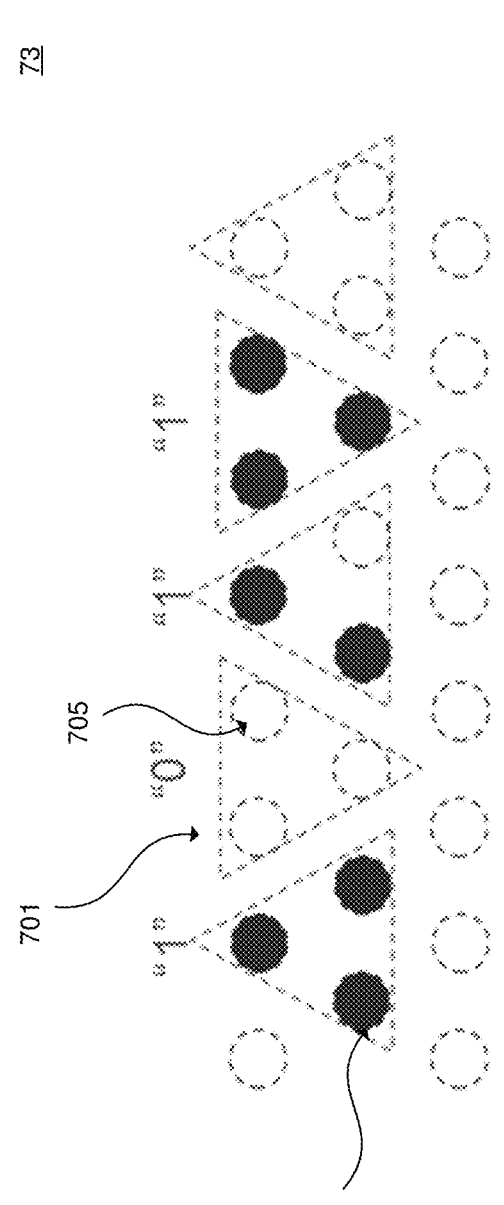

FIGS. 7A-7C are schematic diagrams illustrating methods for encoding/decoding in accordance with an embodiment of the present technology. In the embodiments discussed in FIGS. 7A-7C, a bit area 701 of a pattern 71 (FIG. 7A), 72 (FIG. 7B), or 73 (FIG. 7C) can include more than one dots 703 and/or vacant regions 705. For example, the bit area 701 can have a total of three dots 703 and/or vacant regions 705. If there are at least two dots 703 in the bit area 701, then the bit area 701 represents bit information "1." Otherwise, if there are less than two dots 703 in the bit area 701, then the bit area 701 represents bit information "0." This arrangement can reduce or at least mitigate the risks of misreading the dots 703.

In FIG. 7A, the bit area 701 of the pattern 71 can include three dots 703 and/or vacant regions 705 in a row. In FIG. 7B, the bit area 701 of the pattern 72 can include three dots 703 and/or vacant regions 705 that form a corner shape. In FIG. 7C, the bit area 701 of the pattern 73 can have a triangular shape. In other embodiments, the bit area 701 can include other numbers of dots 703 and/or vacant regions 705, and the bit area 701 can have other suitable shapes. Despite the bit area 701 has been depicted as a close region in FIGS. 7A-C, in some embodiments, the bit area 701 can comprise two or more spatially-separated regions. For example, each of the spatially-separated regions can include one dot 703 or a vacant region 705.

Figure 8:
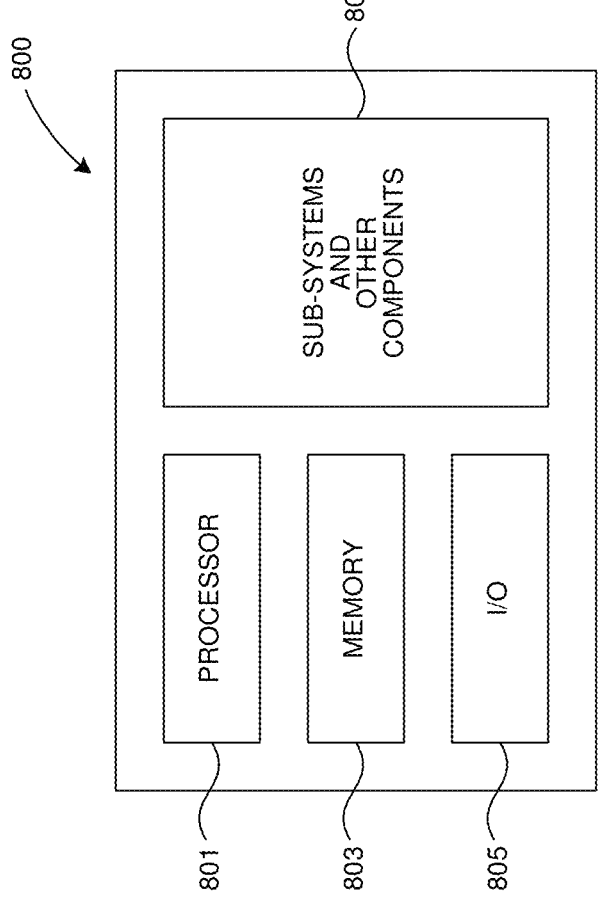
FIG. 8 is a block diagram illustrating a system that incorporates a semiconductor assembly in accordance with an embodiment of the present technology.

FIG. 8 is a block diagram illustrating a system that incorporates a semiconductor assembly in accordance with an embodiment of the present technology. Any one of the semiconductor devices described above with reference to FIGS. 1-7C can be incorporated into any of a myriad of larger and/or more complex systems, a representative example of which is a system 800 shown schematically in FIG. 8. The system 800 can include a processor 801, a memory 803 (e.g., SRAM, DRAM, flash, and/or other memory devices), input/output devices 805, and/or other subsystems or components 807. The semiconductor assemblies, devices, and device packages described above with reference to FIGS. 1-7C can be included in any of the elements shown in FIG. 8. In some embodiments the system 800 can include a non-volatile memory for storing die-specific information for at least some of the components in the system 800. For example, configuration parameters (e.g., voltage, current, delay and/or resistance trimming parameters, redundancy addresses, etc.) can be stored in the non-volatile memory and uploaded to corresponding components at a power-on process of the system 800. The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other examples, the system 800 can be housed in a single unit or distributed over multiple interconnected units, e.g., through a communication network. The components of the system 800 can accordingly include local and/or remote memory storage devices and any of a wide variety of suitable computer-readable media.

Figure 9:
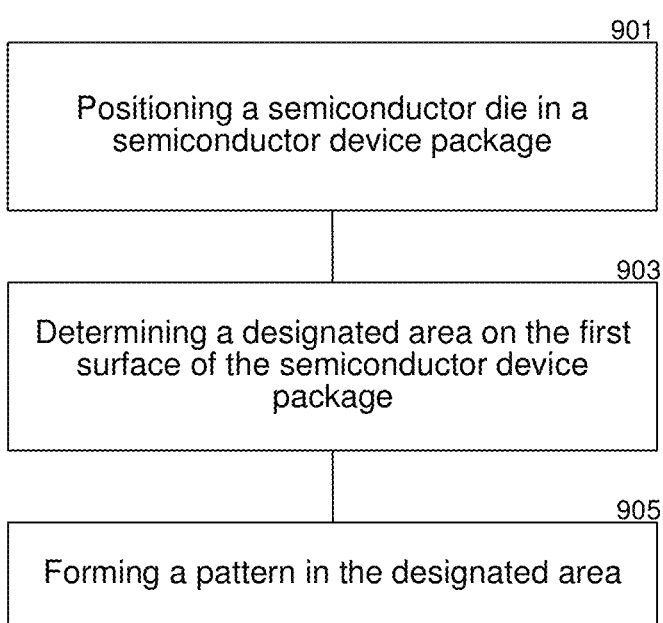
FIG. 9 is a flowchart illustrating a method in accordance with an embodiment of the present technology.

FIG. 9 is a flowchart illustrating a method in accordance with an embodiment of the present technology. The method 900 can be implemented by a system (e.g., the system 100 discussed above). The method 900 is to provide or deliver die-specific information regarding a semiconductor die. At block 901, the method 900 starts by positioning the semiconductor die in a semiconductor device package. The semiconductor device package has a first surface. At block 903, the method 900 continues by determining a designated area on the first surface. As block 905, the method 900 includes forming a pattern in the designated area. The pattern includes multiple bit areas, and each of the bit areas represents a first bit information (e.g., "1") or a second bit information (e.g., "0"). In some embodiments, the pattern can be associated with information for operating the semiconductor die. In some embodiments, the pattern can be configured to be read by a pattern scanner (e.g., the pattern reader 105).

In some embodiments, each of the bit areas can include a square shape, a triangular shape, or a parallelogram shape. In some embodiments, the each of the bit area includes at least one dot or at least one space.

In some embodiments, the pattern can include at least one serpentine line formed by multiple dots. The serpentine line can include (1) at least one first segment (e.g., a horizontal segment) representing the first bit information; and (2) at least one second segment (e.g., a vertical segment) of the at least one serpentine line representing the second bit information. In some embodiments, each of the bit areas includes a third segment (e.g., a diagonal segment) representing a third bit information.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

What is claimed is:

1. A method of forming a semiconductor device package, the method comprising:

positioning a semiconductor die between a first surface of the package and a second surface of the package that is opposite the first surface;

forming a pattern in a designated area of the first surface, the pattern including multiple bit areas, each of the bit areas representing a first bit information or a second bit information, the pattern presenting information for operating the semiconductor die, the pattern being configured to be read by a pattern scanner, wherein each of the bit area includes at least one dot or at least one vacant region.

2. The method of claim 1, wherein each of the bit areas includes a square shape, a triangular shape, and/or a parallelogram shape.

3. The method of claim 1, wherein the first bit information includes a value of one, and wherein the second bit information includes a value of zero.

4. The method of claim 1, wherein the pattern includes at least one serpentine line formed by multiple dots, and wherein a first segment of the at least one serpentine line represents the first bit information, and wherein a second segment of the at least one serpentine line represents the second bit information.

5. The method of claim 4, wherein the first segment of the at least one serpentine line is a horizontal segment, and wherein the second segment of the at least one serpentine line is a vertical segment or a diagonal segment.

6. The method of claim 4, wherein the first segment of the at least one serpentine line is a diagonal segment, and wherein the second segment of the at least one serpentine line is a horizontal segment.

7. The method of claim 1, wherein the pattern includes a horizontal reference line and a vertical reference line configured to indicate boundaries of the pattern.

8. The method of claim 1, wherein the pattern includes a reference configured to a starting point and/or an ending point for the pattern scanner to read the pattern.

9. The method of claim 1, wherein each of the bit areas includes a first segment representing the first bit information or a second segment representing the second bit information.

10. The method of claim 9, wherein the first segment includes a horizontal segment, and wherein the second segment includes a vertical segment.

11. The method of claim 9, wherein each of the bit areas includes a third segment representing a third bit information.

12. The method of claim 11, wherein each of the first segment, the second segment, and third segment includes at least one of a horizontal segment, a vertical segment, and a diagonal segment.

13. The method of claim 1, wherein each of the bit areas includes a first dot representing the first bit information and a second dot representing the second bit information, and wherein the first dot is larger than the second dot.

14. A method of forming a semiconductor device, the method comprising:

forming a machine-readable pattern on an external surface of the semiconductor device, the pattern representing information for operating the semiconductor device, wherein the pattern includes a plurality of bit areas, and wherein each of plurality of bit areas includes at least one dot or at least one vacant region.

15. The method of claim 14, wherein the plurality of bit areas each have a shape that is triangular, rectangular, or parallelogram.

16. The method of claim 14, wherein the pattern includes at least one serpentine line formed by multiple dots, and wherein a first segment of the at least one serpentine line represents a first bit of information, and wherein a second segment of the at least one serpentine line represents a second bit of information.

17. A method of reading information from a semiconductor device, the method comprising:

scanning, with a pattern scanner, a machine-readable pattern on an external surface of the semiconductor device, the pattern representing information for operating the semiconductor device, wherein the pattern includes a plurality of bit areas, and wherein each of plurality of bit areas includes at least one dot or at least one vacant region.

18. The method of claim 17, wherein the plurality of bit areas each have a shape that is triangular, rectangular, or parallelogram.

19. The method of claim 17, wherein the pattern includes at least one serpentine line formed by multiple dots, and wherein a first segment of the at least one serpentine line represents a first bit of information, and wherein a second segment of the at least one serpentine line represents a second bit of information.

20. The method of claim 17, wherein the pattern includes a reference configured to a starting point and/or an ending point for the pattern scanner to read the pattern.

* * * * *